(12) United States Patent
Sandhu et al.

(10) Patent No.: US 6,312,486 B1
(45) Date of Patent: *Nov. 6, 2001

(54) SLURRY WITH CHELATING AGENT FOR CHEMICAL-MECHANICAL POLISHING OF A SEMICONDUCTOR WAFER AND METHODS RELATED THERETO

(75) Inventors: Gurtej Singh Sandhu; Donald Westmoreland, both of Boise; Daniel Koos, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/605,164

(22) Filed: Jun. 27, 2000

Related U.S. Application Data

(63) Continuation of application No. 08/924,468, filed on Aug. 21, 1997, now Pat. No. 6,099,604.

(51) Int. Cl.[7] .................................................. B08B 7/00
(52) U.S. Cl. ........................ 51/307; 51/308; 51/309; 106/3; 438/692; 438/693; 216/89; 252/79.1
(58) Field of Search ............................ 106/3; 438/692, 438/693; 51/307, 308, 309; 216/89; 252/79.1

(56) References Cited

U.S. PATENT DOCUMENTS

| | | | |
|---|---|---|---|
| 4,910,155 | 3/1990 | Cote et al. ........................... 437/8 |
| 4,954,142 | * 9/1990 | Carr et al. ............................ 51/309 |
| 5,300,155 | 4/1994 | Sandhu et al. ....................... 148/33 |
| 5,318,927 | 6/1994 | Sandhu et al. ...................... 437/225 |
| 5,354,490 | 10/1994 | Yu et al. .............................. 252/79.1 |
| 5,366,542 | * 11/1994 | Yamada et al. ....................... 106/3 |
| 5,735,963 | * 4/1998 | Obeng .................................... 134/3 |
| 6,099,604 | * 8/2000 | Sandhu et al. ........................ 51/307 |

* cited by examiner

*Primary Examiner*—C. Melissa Koslow
(74) *Attorney, Agent, or Firm*—Dorsey & Whitney LLP

(57) ABSTRACT

A slurry composition enhances the removal of polish-resistant surface moieties from the surface of a semiconductor wafer during chemical-mechanical polishing. The slurry composition is a mixture including a solvent, a plurality of abrasive particles, and a chelating agent. The abrasive particles abrade the surface of the wafer to remove surface moieties and underlying material. The chelating agent is selected to react with polish-resistant surface moieties on the surface of the wafer surface, to thereby render the surface moieties easier to remove from the surface layer with substantially non-aggressive chemical-mechanical polishing techniques. In operation, the surface moieties and the underlying bulk material are removed by a combination of the chemical effects of the chelating agent and the mechanical effects of the abrasive particles.

25 Claims, 2 Drawing Sheets

US 6,312,486 B1

SLURRY WITH CHELATING AGENT FOR CHEMICAL-MECHANICAL POLISHING OF A SEMICONDUCTOR WAFER AND METHODS RELATED THERETO

This application is a continuation of U.S. patent application Ser. No. 08/924,468, filed Aug. 21, 1997, now U.S. Pat. No. 6,099,604.

TECHNICAL FIELD

The present invention relates to slurry compositions and methods for using the slurry compositions in chemical-mechanical polishing of oxide or nitride layers from semiconductor wafers.

BACKGROUND OF THE INVENTION

Chemical-mechanical polishing ("CMP") processes are widely used to remove material from the surface of semiconductor wafers, and they are particularly useful for planarizing wafers, and layers thereof, in the production of ultra-high density integrated circuits. In a typical CMP process, a wafer is pressed against a polishing pad in the presence of a slurry under controlled chemical, pressure, velocity, and temperature conditions. The slurry generally contains small, abrasive particles that abrade the surface of the wafer, and chemicals that etch and/or oxidize the newly formed surface of the wafer. The polishing pad is generally a planar pad made from a continuous phase matrix material such as polyurethane. Thus, when the pad and/or the wafer moves with respect to the other, material is removed from the surface of the wafer mechanically by the abrasive particles and chemically by the etchants and/or oxidants in the slurry.

FIG. 1 schematically illustrates a polishing machine 10, often called a planarizer, used in a conventional CMP process. The polishing machine 10 has a platen 20, a wafer carrier 30, a polishing pad 40, and a slurry 44 on the polishing pad. An under-pad 25 is typically attached to the upper surface 22 of platen 20, and the polishing pad 40 is positioned on the under-pad 25. In conventional CMP machines, a drive assembly 26 rotates the platen 20 as indicated by arrow A. In other existing CMP machines, the drive assembly 26 reciprocates the platen 20 back and forth as indicated by arrow B. The motion of the platen 20 is imparted to the pad 40 through the under-pad 25 because the polishing pad 40 frictionally engages the under-pad 25. The wafer carrier 30 has a lower surface 32 to which a wafer 12 may be attached, or the wafer 12 may be attached to a resilient pad 34 positioned between the wafer 12 and the lower surface 32. The wafer carrier 30 may be a weighted, free-floating wafer carrier, or an actuator assembly 36 may be attached to the wafer carrier 30 to impart axial and rotational motion, as indicated by arrows C and D, respectively.

In the operation of the conventional polishing machine 10, the wafer 12 is positioned face-downward against the polishing pad 40, and then the platen 20 and the wafer carrier 30 move relative to one another. As the face of the wafer 12 moves across the planarizing surface 42 of the polishing pad 40, the polishing pad 40 and the slurry 44 remove material from the wafer 12.

CMP processes must consistently and accurately produce a uniform, planar surface on the wafer because such a surface is needed in order to accurately focus optical or electromagnetic circuit patterns on the surface of the wafer. As the density of integrated circuits increases, it is often necessary to accurately focus the critical dimensions of the circuit-pattern to achieve a resolution of approximately 0.35–0.5 $\mu$m. Focusing the circuit-patterns to such small tolerances, however, is very difficult when the distance between the emission source and the surface of the wafer varies because the surface of the wafer is not uniformly planar. In fact, several devices may be defective on a wafer having a non-uniform planar surface. Thus, CMP processes must create a highly uniform, planar surface.

In the competitive semiconductor industry, it is also desirable to maximize the throughput of finished wafers. The throughput of wafers in a CMP process is a function of several factors, one of which is the rate at which the thickness of the wafer decreases as it is being planarized (the "polishing rate"). Because the polishing period per wafer (the time needed to achieve a desired wafer planarity and end-point) generally decreases with increasing polishing rate, it is desirable to maximize the polishing rate within controlled limits to increase the number of finished wafers that are produced in a given period of time.

The polishing rate of a wafer is often retarded by surface groups which form when freshly exposed surface comes into contact with the CMP slurry. The CMP processing of silicon oxide illustrates this problem. During CMP of a silicon oxide wafer, there is a continuous formation of surface Si—OH groups. These Si—OH groups can be very difficult to dislodge from the underlying bulk silicon oxide, and thus their presence retards the polishing rate of the CMP process. To increase the polishing rate of a silicon oxide wafer, conventional CMP processes use aggressive mechanical polishing techniques (e.g., high down-forces and high pad velocities) to physically remove the Si—OH groups and some of the underlying silicon oxide from the wafer.

Aggressive mechanical polishing techniques, however, tend to reduce the uniformity of the polished surface on the wafer. A high pad velocity, for example, exacerbates the center-to-edge gradient in the polishing rate so that the polishing rate at the edge of the wafer is greater than that at the center of the wafer. Similarly, high down-forces worsen dishing over large area features formed on the wafer and reduce the ability to control the planarization process. Therefore, in order to produce a desirably uniform planar surface on a wafer, the polishing rate is limited to a relatively low rate that is not overly aggressive.

Accordingly, there is a strongly-felt need in the art for improved chemical-mechanical polishing slurries that afford an increased polishing rate for semiconductor wafers and layers present thereon. The present invention fulfills this need, and provides other related advantages.

SUMMARY OF THE INVENTION

The invention provides for a slurry composition and a method for its preparation. The slurry enhances the removal of polish-resistant surface moieties from the surface of a wafer during chemical-mechanical polishing of a semiconductor wafer. The inventive slurry composition is formed by mixing together components including a solvent, a plurality of abrasive particles, and at least one chelating agent The abrasive particles are selected so that they preferably abrade the surface of the wafer to remove some of the surface moieties and the underlying bulk material. The chelating agent is preferably selected to react with the polish-resistant surface moieties on the surface of the wafer and to make the surface moieties easier to remove from the wafer with substantially non-aggressive chemical-mechanical polishing techniques. In operation, the surface moieties and the underlying bulk material are removed by a combination of the chemical effects of the chelating agent and the mechanical effects of the abrasive particles.

The invention also provides an improved method for chemical-mechanical polishing of a semiconductor wafer surface. At least one of the polishing pad and the wafer is moved with respect to the other so that the surface of the wafer passes over the polishing pad in the presence of the slurry to remove material from the wafer surface. The chelating agent may react with the polish-resistant surface moieties on the surface of the wafer to make the surface moieties easier to remove from the underlying material with substantially non-aggressive chemical-mechanical polishing techniques. These and other aspects of this invention will become evident upon reference to the attached drawings and following detailed description.

DETAILED DESCRIPTION OF THE INVENTION

Figure 1:
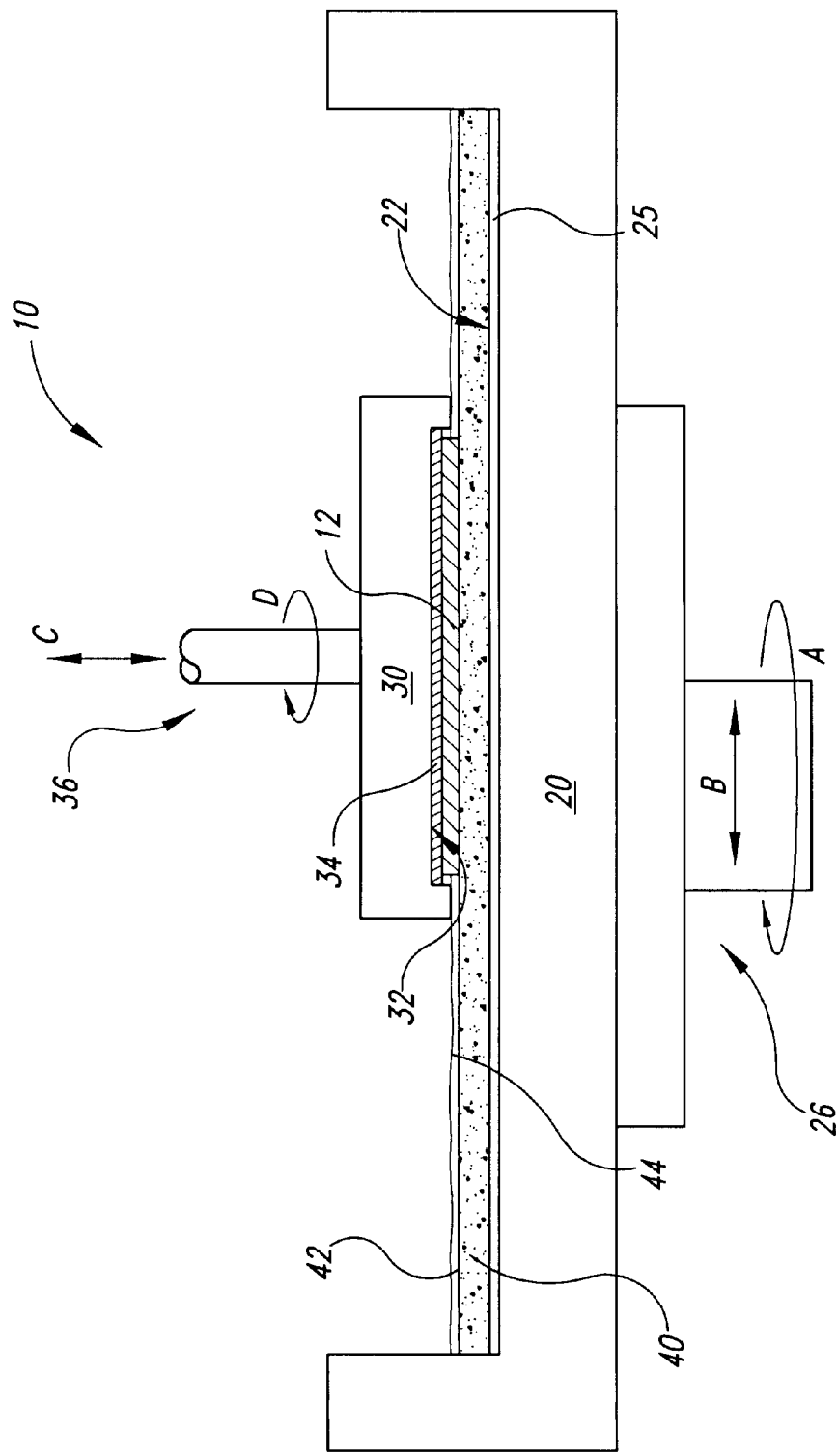
FIG. 1 is a schematic cross-sectional view of a chemical-mechanical planarization machine in accordance with the prior art.

The invention provides a slurry that increases the polishing rate in chemical-mechanical polishing of wafers without using overly aggressive mechanical CMP techniques. The wafers which are polished according to the present invention preferably have a surface formed from metal oxide, metal nitride, metalloid oxide or metalloid nitride. Metalloids include arsenic, antimony, silicon and bismuth, for example. For convenience, the invention will be described primarily as it relates to wafers having a silicon oxide surface, however the invention is equally applicable to wafers having a surface formed of metal oxide, metal nitride, metalloid nitride or metalloid oxide other than silicon oxide. As used herein, a wafer surface includes a layer of material which forms part of the wafer.

In previous CMP methods for wafers, the surface of the wafer which contacts the slurry and polishing pad is primarily abraded away from the underlying material. Thus, surface moieties are mechanically separated from the underlying bulk material and become "dislodged" surface moieties. In a CMP process of the invention, it is intended that at least some of the surface moieties undergo a chemical change that enhances their removal from the underlying material without using mechanically aggressive CMP techniques. Thus, the surface moieties and the dislodged surface moieties will typically have different chemical structures.

It is difficult to give a precise description of the chemical reactions that occur during the dislodging process. In general, the chemistry will depend on the composition of the wafer's surface and the composition of the slurry. However, as an example, and in the case where the wafer's surface and the underlying material is silicon oxide, and the slurry is aqueous-based, the surface will consist of terminal Si—OH moieties linked together through oxygen atoms. Underlying and chemically bonded to the surface Si—OH moieties is a repeating network of silicon oxide. As surface moieties are removed from the bulk silicon oxide, the freshly exposed silicon oxide quickly reacts with water to form new Si—OH surface moieties. The dislodgment process converts surface Si—OH moieties to dislodged moieties of the formula $[SiO_x(OH)_{4-2x}]_n$ where $SiO_2$ may be complexed to one or more water molecules, as shown in the examples below:

| Formula | n[a] | Name | Sol. (H$_2$O, 20°)/ mol l$^{-1}$ |
| --- | --- | --- | --- |
| H$_{10}$S$_2$O$_9$ | 2.5 | Pentahydrosilicic acid | 2.9 × 10$^{-4}$ |
| H$_4$SiO$_4$ | 2 | Orthosilicic acid | 7 × 10$^{-4}$ |
| H$_6$Si$_2$O$_7$ | 1.5 | Pyrosilicic acid | 9.6 × 10$^{-4}$ |
| H$_2$SiO$_3$ | 1 | Metasilicic acid | 10 × 10$^{-4}$ |
| H$_2$Si$_2$O$_5$ | 0.5 | Disilicic acid | 20 × 10$^{-4}$ |

[a]Number of mols H$_2$O per mol SiO$_2$, i.e., SiO$_2$nH$_2$O.

The slurry of the invention contains three essential components, namely solvent, abrasive particles and at least one chelating agent. The inclusion of solvent and abrasive particles in a slurry for CMP is well known in the art, and any solvent(s) and abrasive particles suitably employed in a conventional slurry and CMP process may be used in the inventive composition and method described herein.

In general the solvent is a liquid at the operating temperature of the CMP process, which is typically conducted at room temperature (i.e., at about 25° C.). The solvent may be a pure liquid, (i.e., formed of a single chemical species) or may be a mixture of liquids. The solvent may include inorganic components, such as water (which provides for an aqueous solvent), or a perfluoronated alkane (which is an exemplary non-aqueous inorganic solvent). The solvent may also, or alternatively, contain organic components, where hydrocarbons are exemplary organic components. Thus, the solvent may be aqueous (contains water) or non-aqueous (does not contain water), organic or inorganic. The solvent may be a mixture of solvent types, such as water in combination with a water-miscible organic solvent (e.g., water and poly(alkylene oxide)). In a preferred embodiment of the invention, the solvent contains water, and more preferably contains water as the major or sole component of the solvent.

The slurry also contains abrasive particles, where the abrasive particles are not soluble in the solvent. The combination of solvent and abrasive particles affords a slurry wherein the particles are suspended in the solvent In general the abrasive particles may be any hard, finely divided substance that can abrade silicon, silica, metal metalloid and/or other materials that are used in the fabrication of microelectronic devices. Such abrasive particles are well known in the art, and include, without limitation, alumina, aluminum dioxide, silica,. silicon dioxide, silicon nitrite, ceria and diamond.

The chelating agent of the invention is a chemical species that can participate in a chelation reaction to form a chelate. As defined in Hackh's Chemical Dictionary (McGraw Hill, 4th Ed., 1972), chelation is the reversible reaction of a metallic ion with a molecule or ion to form a complex molecule which does not have all or most of the characteristics of the original metallic ion. Hackh's defines a chelate as a compound with a molecular structure in which a ring is formed by the residual valencies of neighboring atoms. A chelating agent is defined in the McGraw-Hill Dictionary of Scientific and Technical Terms (3rd ed., 1984) as an organic compound in which atoms form more than one coordinate bonds with metals in solution. Chelating agents according to the invention are thus well-known in the chemical arts. However, such chelating agents have not previously been recognized as usefully included in a slurry for CMP processes.

The incorporation of one or more chelating agents into a slurry for CMP has been surprisingly found to increase the rate at which a CMP process can remove material from a wafer or surface layer thereof While not intending to be bound by the following theory, it is believed that the chelating agent serves in more than one beneficial capacity when included in a slurry for CMP processes. Initially, the chelating agent is believed to interact with the surface of the wafer and thereby weaken the bonds which hold the surface moieties to the underlying material. More specifically, it is believed that the chelating agent may interact with the surface moiety by forming a complex with the metal or metalloid of the surface moiety. In this way, the chelating agent is believed able to increase the rate at which surface moieties separate from the underlying metal/metalloid oxide or nitride.

In addition, it is believed that after surface moieties have been dislodged from the wafer by the CMP process, the chelating agent is able to stabilize the dislodged moiety in the slurry, thus allowing the dislodged moiety to more rapidly move away from the wafer surface, which increases the rate at which wafer surface is exposed to the slurry.

Furthermore, the incorporation of a chelating agent in a slurry for CMP processing can allow for preferential removal of surface moieties from a wafer. Thus, in the case where the wafer surface is composed, for example, of a mixed metal oxide layer of a first metal and a second metal, the slurry of the invention may be used to achieve the preferential removal of surface moieties containing the first metal. For example, the removal of metal contaminants such as sodium, potassium, or iron from a metal film or borophosphate silica glass on a wafer is highly desirable.

The choice of the chelating agent to achieve preferential removal of surface moieties depends, to a large extent, on the identities of the metals and/or metalloids in the wafer's surface, and factors which distinguish those metals/metalloids. For instance, metals and metalloids may be distinguished by their size. In this case, a chelating agent which is large enough to chelate to the smaller metal/metalloid but not so large that it effectively chelates to the larger metal/metalloid, is suitable employed in a slurry of the invention to achieve the selective removal of surface moieties containing the smaller metal/metalloid. This situation arises, for example, where the wafer's surface is formed from silicon oxide and titanium oxide. The slurry of the invention thus allows the preferential removal of silicon-based surface moieties in favor of the titanium-based surface moieties. Similarly, the chelating agent may be a rigid structure, where the chelating atoms of the chelating agent are fixed at such a distance apart that they effectively chelate to a larger atom, but not to a smaller atom. In this instance, titanium-based surface moieties may be removed from the bulk metal oxide in favor of silicon-based surface moieties.

The chelating agent is organic and polydentate (i.e., formed, at least in part, from carbon and hydrogen, and has at least two separate sites with which to bond a metal or metalloid). With such chelating agents, the chelate is an organometallic (metalorganic) species having a ring formed of the metal or metalloid and the polydentate chelating agent In such an instance, the chelating agent is seen to form a ligand of the organometallic species.

Essentially any chelating known in the art or subsequently developed may be included in the slurry of the invention. Preferred chelating agents include, but are not limited to: polycarboxylic acids and salts thereof, such as citric acid, disodium citrate, ethylenediaminetetraacetate (EDTA) and tetra sodium ethylenediaminetetraacetate; polyamines such as ethylene diamine, 1,8-diazabicyclo[5.4.0]undec-7-ene (DBU) and 1,4-diazabicyclo[2.2.2]octane DABCO); polyols (i.e., polyhydric organic molecules, for example, aliphatic polyols) such as ethylene glycol and other members of the glycol family, and aromatic polyols such as catechol and gallol; polyethers such as crown ethers; polyetherdiols such as the polymerization product of ethylene oxide and/or propylene oxide; and polyetherdiamines such as amine-terminated polyethers, (i.e., polyetherdiols wherein the diol groups are replaced with amino groups). Bidentate chelating agents, and particularly bidentate polyamines are a preferred class of chelating agent useful in the inventive slurry.

In a slurry according to the invention, the chelating agent preferably constitutes about 0.005 to about 15 weight percent of the entire weight of the slurry, and more preferably about 1.0 to about 5.0 weight percent of the entire weight of the slurry. The abrasive particles constitute about 0 to about 25 weight percent of the entire weight of the slurry. Preferably, abrasive particles constitute about 10 to about 15 weight percent, and more preferably about 13 weight percent of the entire weight of the slurry.

The slurry of the invention may, and preferably does contain optional components in addition to solvent, abrasive particles and chelating agent(s). A metal ion is a preferred additional component in a slurry of the invention. The metal ion maybe monovalent (e.g., an ion of a metal from Group 1 of the Periodic Table) or it may be polyvalent (e.g., an ion of a metal from Group 2 of the Periodic Table). Preferred monovalent metal ions are sodium and potassium ions, while preferred polyvalent metal ions are magnesium and calcium ions.

The metal ion will normally be in a salt or complex form prior to being added to the slurry. Preferably, the salt or complex form of the metal ion is readily soluble in the slurry. Metal hydroxides are a preferred metal salt or complex to add to an aqueous slurry of the invention. A chelate of a metal ion and a chelating agent is another preferred form in which the metal ion may be added to an aqueous or non-aqueous slurry of the invention. EDTA complexed with a polyvalent metal ion is a preferred chelate which may be added to a slurry according to the invention.

While not intending to be bound by the following theory, it is believed that the polyvalent metal ion is able to complex with the hydroxyl or amino groups (and/or the protonated or deprotonated derivatives thereof depending on the pH of the slurry) of a surface moiety. For example, in an aqueous slurry the metal ions will initially be complexed to water molecules. However, these water molecules can be displaced by the wafer surface hydroxyl or amino groups, to thereby form a chelate. Such chelation is believed to destabilize the bonds between the surface moiety and the underlying material that forms the wafer, and thus encourage the formation of a dislodged surface moiety. Furthermore, the chelate formed of the polyvalent metal ion and the dislodged surface moiety typically has improved solubility or dispersability in the slurry solvent, especially when in further combination with a chelating agent, compared to the solubility/dispersability of the dislodged surface moiety in the absence of polyvalent metal ion and chelating agent.

Another optional component of a preferred slurry according to the invention is a pH buffer. The buffer is an agent that acts to maintain the pH of the slurry during the CMP process. The slurry pH in a CMP process, at least in the case where the substrate is an oxide or nitride layer, is an important factor because the pH generally determines the precise chemical identity of the surface moieties. Thus, when the surface is a metal or metalloid oxide, under high pH condition the surface moieties will more often contain M—O$^-$ groups, where M stands for a particular metal or metalloid However, under low pH condition, the surface moieties will more often contain M—OH or M—OH$_2^+$ groups. Thus, since the pH of the slurry will significantly affect the chemical identity of the surface moieties, it will also influence the rate at which CMP achieves a planar surface.

The pH of a slurry of the invention may be basic, neutral or acidic. The preferred pH will depend on the composition of the surface being subjected to CMP and the composition of the slurry. The identity of the buffer is typically selected so that it provides buffering action within the desired pH range. Acid or base (e.g., ammonium hydroxide) may be added to the slurry in order to achieve a pH within a desired range. Prior art slurries useful in CMP processes typically incorporate a pH buffer, and thus one skilled in the art is knowledgeable about selecting a pH buffer for a particular CMP process. Furthermore, many reference books identify buffer agents that are appropriate for maintain a desired pH range.

Another optional component of a preferred slurry is a surfactant. The surfactant generally aids in solubilizing and/or suspending the dislodged surface moieties in the slurry. Again, the chemical structure of the surfactant should be selected in view of the composition of the wafer surface being subjected to CMP. Surfactants are commonly employed in prior art slurries for use in CMP processes, and such surfactants are suitably employed in a slurry of the invention. One of ordinary skill in the art is familiar with selecting one or more surfactants for a specific CMP process. For example, tetramethylammonium hydroxide ("TMAH") may be used as a surfactant. Commercial surfactants such as Triton X are also commonly used. Other optional components that are traditionally included in a slurry for CMP process may also be present in a slurry according to the invention.

A slurry of the invention is prepared by combining solvent, abrasive particles and chelating agent, optionally with one or more other ingredients. After all of the ingredients are combined, the slurry should be stirred to achieve a homogeneous mixture. The homogeneous slurry is then ready for use in a CMP process according to the invention. A slurry of the invention may be prepared by adding one or more chelating agents to a commercially available slurry.

The wafer surface which may be contacted with a slurry as described herein may be formed from one or more of metal oxide, metal nitride, metalloid oxide or metalloid nitride. Typical examples of materials from which wafer surfaces are formed include, without limitation, BPSG and ferroelectric materials. Without limiting the scope of the invention, the oxide or nitride layers may be made from the following: BPSG, BaSrTiO$_3$, PbZrTiO$_3$, SrBiTaO$_3$, Ta$_2$O$_5$, GeO$_2$, and Si$_3$N$_4$. As seen from these examples, mixed oxides of metal and metalloids (e.g., SrBiTaO$_3$) are included with the meaning of the terms metal oxide and metalloid oxide, as used herein. Likewise, mixed nitrides of metal and metalloids are also included within the terms metal nitride and metalloid nitride, as these terms are used herein. A metalloid oxide layer in which silicon is the predominate, or even the only, metalloid present in the layer is preferred.

The wafer surface being treated by CMP and slurries as described herein, may contain so-called impurities, where an impurity is any atom, molecule or other chemical species that is not a metal oxide, metal nitride, metalloid oxide or metalloid nitride. One impurity commonly found in the surface of wafers used in microelectronic fabrication is carbon. However, the presence of carbon in the wafer surface may not be detrimental to the inventive process, and in fact may actually be advantageous. For example, where the concentration of carbon is minute in a metal oxide layer, the carbon may provide a site where an enhanced dislodgment rate of surface moieties is observed.

Figure 2:
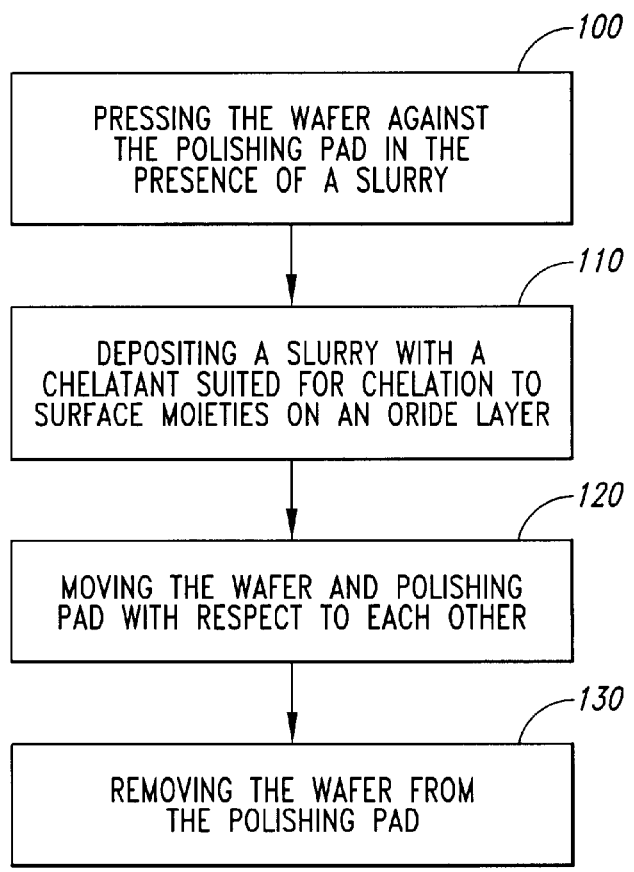
FIG. 2 is a flow diagram illustrating a chemical-mechanical polishing method in accordance with the invention.

Turning now to the Figures, FIG. 2 illustrates a preferred embodiment of the invention, which is the chemical-mechanical polishing of an oxide layer on a semiconductor wafer. In the first step 100 of the method, a wafer is pressed against a polishing surface of a polishing pad 40, as shown on the CMP machine 10 in FIG. 1. The down-force between the wafer and the polishing surface of the polishing pad is typically between 2 and 10 psi, and preferably towards the lower end of the range to reduce the mechanical aspects of the polishing process. In the second step 110 of the method, a slurry with a chelating agent is deposited on the polishing pad. The chelating agent chelates with moieties on the surface of the metal or metalloid oxide layer (e.g., Si—OH groups), and stabilizes the formation of dislodged surface moieties (e.g. silicate molecules). These dislodged surface moieties are readily dispersed in the slurry with the aid of the chelating agent Accordingly, aggressive mechanical polishing techniques are unnecessary to achieve rapid polishing of the metal oxide surface.

The third step 120 of the method of the invention is to move the wafer and the polishing pad with respect to each other to impart relative motion therebetween. As the wafer and the polishing pad move with respect to one another, the polishing pad and slurry remove additional surface moieties from the oxide layer. In the fourth step 130 of the method, which occurs after the desired amount of abrasion has happened, the CMP process is discontinued and the wafer is removed from the polishing pad.

Figure 3:
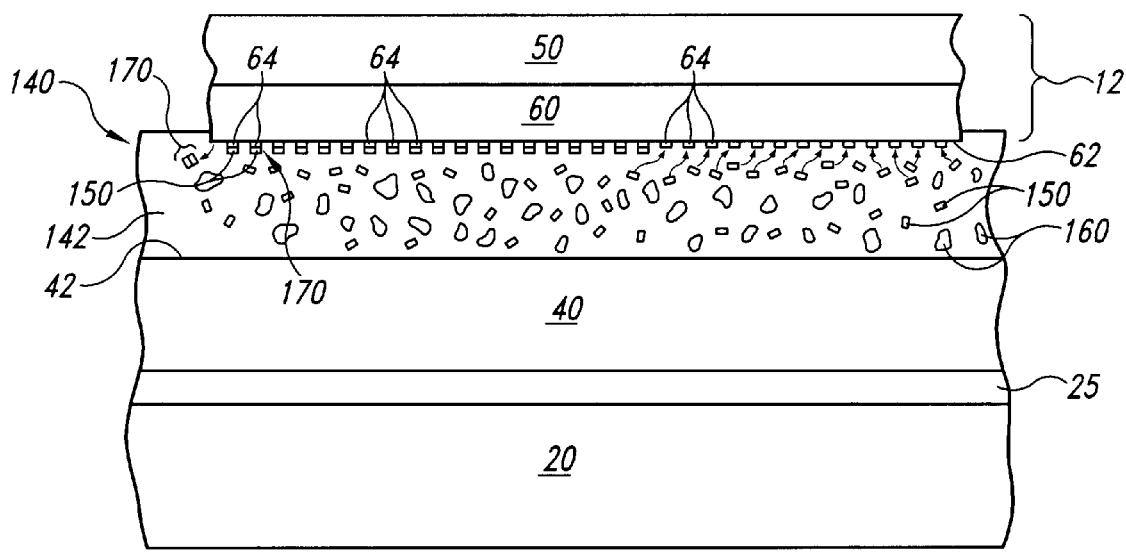
FIG. 3 is a fragmentary, schematic cross-sectional view of a slurry in accordance with the invention acting on a semiconductor wafer in a chemical-mechanical polishing process.

FIG. 3 illustrates a proposed theory as to how a preferred wafer 12 is polished in accordance with the method of the invention. The wafer 12 has a substrate 50 with a silicon oxide layer 60 formed over the substrate 50. The present invention is not directed towards the structure of the wafer 12, and thus many devices, features and other layers of material may also be formed on the wafer 12. The bottom surface 62 of the oxide layer 60 is positioned in the slurry 140, which contains a solvent 142, a chelating agent 150 dissolved or otherwise dispersed throughout the solvent 142, and a plurality of abrasive particles 160 suspended in the solvent 142. The bottom surface 62 comprises a number of surface moieties 64 (in this case, primarily silicon hydroxide groups), which are chemically bound to the bottom surface 62 of the oxide layer 60. During the polishing process, the chelating agents 150 undergo a chelation reaction with the surface moieties 64 to form chelates 170 on the bottom surface 62 of the oxide layer 60. The chelates 170 dislodge from, and move away from the surface 62 under the polishing action.

The space between the bottom surface 62 of the oxide layer 60 and the polishing surface 42 of the polishing pad 40 is exaggerated in FIG. 3 to better illustrate the operation of the slurry 140 of the invention. It will be appreciated, therefore, that the bottom surface 62 of the oxide layer 60 is generally positioned proximate to the polishing surface 42 so that the polishing surface and/or the abrasive particles 160 engage the bottom surface 62 of the oxide layer 60.

The following examples are offered by way of illustration, not limitation:

EXAMPLE 1

The user can start with a commercially available KOH-based slurry such as CAB-O-SPERSE SC-1 from Cabot Corporation, Cab-O-Sil Division, Tuscola, Ill. To 20 liters of SC-1 as received, add between 200 and 500 mL of ethylenediamine as supplied by the Aldrich Chemical Co., Milwaukee, Wis. Mix the solution/slurry thoroughly and use it in a CMP process (BPSG removal) in a normal manner. The slurry will have the same physical characteristics as the original SC-1, namely a density of 1.2 and a pH of 10–10.5.

EXAMPLE 2

A similar preparation can be undertaken using a commercially available ammonia-based slurry such as ILD1300 from Rodel, Inc. of Newark, Del. To 20 liters of ILD1300, add 200 to 400 mL of propylene glycol and stir the solution thoroughly. The new slurry solution will have all of the same physical characteristics as the original ILD1300.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A composition for chemical-mechanical polishing of a semiconductor wafer surface having polish-resistant surface moieties thereon, comprising:
    a slurry comprising an aqueous solvent and about 0.1 to about 25 weight percent of abrasive particles for chemical-mechanical polishing of a semiconductor wafer;
    a pH buffering agent;
    an ion selected from an ion of Group II elements of the Periodic Table; and
    a chelating agent selected from the group consisting of polycarboxylic acid and salts thereof; polyamines; polyols; polyethers; polyetherdiols; and polyetherdiamines.

2. The composition of claim 1 wherein the ion is selected from magnesium and calcium ions.

3. The composition of claim 1 wherein the chelating agent is about 0.005 to about 15 weight percent of the slurry.

4. The composition of claim 1 wherein the chelating agent is about 1.0 weight percent to about 5.0 weight percent of the total weight of the slurry.

5. The composition of claim 1 wherein the chelating agent is about 3.0 weight percent of the total weight of the slurry.

6. The composition of claim 1 wherein the solvent further comprises a water miscible organic solvent.

7. The composition of claim 1 wherein the solvent further comprises a peflourantated alkane or (poly)alkylene oxide.

8. The composition of claim 1 wherein the abrasive particles are selected from the group consisting of alumina, silica, ceria, diamond and silicon nitride.

9. The composition of claim 1, further comprising a second ion selected from potassium and sodium ions.

10. The composition of claim 9 wherein the second ion is polyvalent.

11. The composition of claim 1, further comprising a surfactant.

12. The composition of claim 1 wherein the chelating agent is EDTA.

13. The composition of claim 1 wherein the chelating agent is ethylene diamine.

14. The composition of claim 1 wherein the chelating agent is a diamine selected from the group consisting of ethylenodiamine, 1,4-diazabicyclo[2.2.2]octane and 1,8-diazabicyclo[5.4.0]undecene.

15. The composition of claim 14 wherein the slurry further comprises a surfactant.

16. The composition of claim 1 wherein the chelating agent is catechol.

17. The composition of claim 1 wherein the chelating agent is gallol.

18. A composition for chemical-mechanical polishing of a semiconductor wafer surface having polish-resistant surface moieties thereon, comprising:
    a slurry comprising water and about 0.1 to about 25 weight percent abrasive particles for chemical-mechanical polishing of a semiconductor wafer;
    a pH buffering agent;
    an ion selected from the group consisting of ions of Group II elements of the Periodic Table; and
    EDTA or a salt thereof at about 0.005 to about 15 weight percent of the slurry.

19. The composition of claim 18 wherein the EDTA constitutes about 1.0 weight percent to about 5 weight percent of the total weight of the slurry.

20. The composition of claim 18 wherein the EDTA constitutes about 3.0 weight percent of the total weight of the slurry.

21. The composition of claim 18 wherein the solvent comprises water and a water miscible organic solvent.

22. The composition of claim 18 wherein the solvent comprises a peflourantated alkane or (poly)alkylene oxide.

23. The composition of claim 18 wherein the abrasive particles are selected from alumina, silica, ceria, diamond and silicon nitride.

24. The composition of claim 18, further comprising a second ion selected from potassium and sodium ions.

25. The composition of claim 18, further comprising a surfactant.

* * * * *